（12） United States Patent
Haywood et al.

(10) Patent No.: US 11,803,323 B2
(45) Date of Patent: Oct. 31, 2023

(54) CASCADED MEMORY SYSTEM

(71) Applicant: RAMBUS INC., San Jose, CA (US)

(72) Inventors: Christopher Haywood, Cary, NC (US); Frederick A. Ware, Los Altos Hills, CA (US)

(73) Assignee: RAMBUS INC., San Jose, CA (US)

( * ) Notice: Subject to any disclaimer, the term of this patent is extended or adjusted under 35 U.S.C. 154(b) by 0 days.

(21) Appl. No.: 17/608,426

(22) PCT Filed: Apr. 28, 2020

(86) PCT No.: PCT/US2020/030322
§ 371 (c)(1),
(2) Date: Nov. 2, 2021

(87) PCT Pub. No.: WO2020/226949
PCT Pub. Date: Nov. 12, 2020

(65) Prior Publication Data
US 2022/0253240 A1 Aug. 11, 2022

Related U.S. Application Data

(60) Provisional application No. 62/844,663, filed on May 7, 2019.

(51) Int. Cl.
*G06F 3/06* (2006.01)
(52) U.S. Cl.
CPC .......... *G06F 3/0656* (2013.01); *G06F 3/061* (2013.01); *G06F 3/0673* (2013.01)

(58) Field of Classification Search
CPC ......... G06F 3/065; G06F 3/061; G06F 3/0673
See application file for complete search history.

(56) References Cited

U.S. PATENT DOCUMENTS

| 5,346,117 | A | 9/1994 | Kohn et al. | |
|---|---|---|---|---|
| 2008/0077732 | A1* | 3/2008 | Risse | G06F 13/1684 711/E12.083 |
| 2010/0070690 | A1 | 3/2010 | Amer et al. | |
| 2011/0138133 | A1 | 6/2011 | Shaeffer | |
| 2012/0260137 | A1* | 10/2012 | Berke | G11C 29/50 714/E11.159 |
| 2017/0285992 | A1* | 10/2017 | Vogt | G06F 13/1684 |

OTHER PUBLICATIONS

PCT International Search Report and Written Opinion, PCT/US2020/030322, dated Jan. 8, 2019, 15 Pages.

* cited by examiner

*Primary Examiner* — Edward J Dudek, Jr.
(74) *Attorney, Agent, or Firm* — Fenwick & West LLP

(57) ABSTRACT

A cascaded memory system includes a memory module having a primary interface coupled to a memory controller via a first communication channel and a secondary interface coupled to a second memory module via a second communication channel. The first memory module buffers and repeats signals received on the primary and secondary interfaces to enable communications between the memory controller and the secondary memory module.

21 Claims, 5 Drawing Sheets

CASCADED MEMORY SYSTEM

BACKGROUND

As memory bus speeds increase, maintaining good signal integrity becomes increasingly difficult. In multi-drop data topologies, multiple memory devices share data signals in order to expand memory capacity without increasing the number of data pins on the memory controller or data lines on the motherboard. However, multi-drop data topologies can degrade signal integrity due to increased loading characteristics, thereby reducing speed at which memory can run.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

A cascaded memory system includes a memory module having a primary interface coupled to a memory controller via a first communication channel and a secondary interface coupled to a second memory module via a second communication channel. The first memory module buffers and repeats signals received on the primary and secondary interfaces to enable communications between the memory controller and the secondary memory. The second communication channel may have a data width that is 1/N times the data width of the first communication channel. The secondary interface may communicate with the second memory module over the second communication channel at a data rate that is N times the data rate between the memory controller and the primary interface communicated over the first communication channel, where N is a power of 2. In an embodiment, multiple memory modules may be chained serially in this way with each memory module in the chain buffering and repeating data to the next memory module in the chain. Additionally, a memory module may buffer and repeat data to two or more downstream memory modules in parallel.

Figure 1:
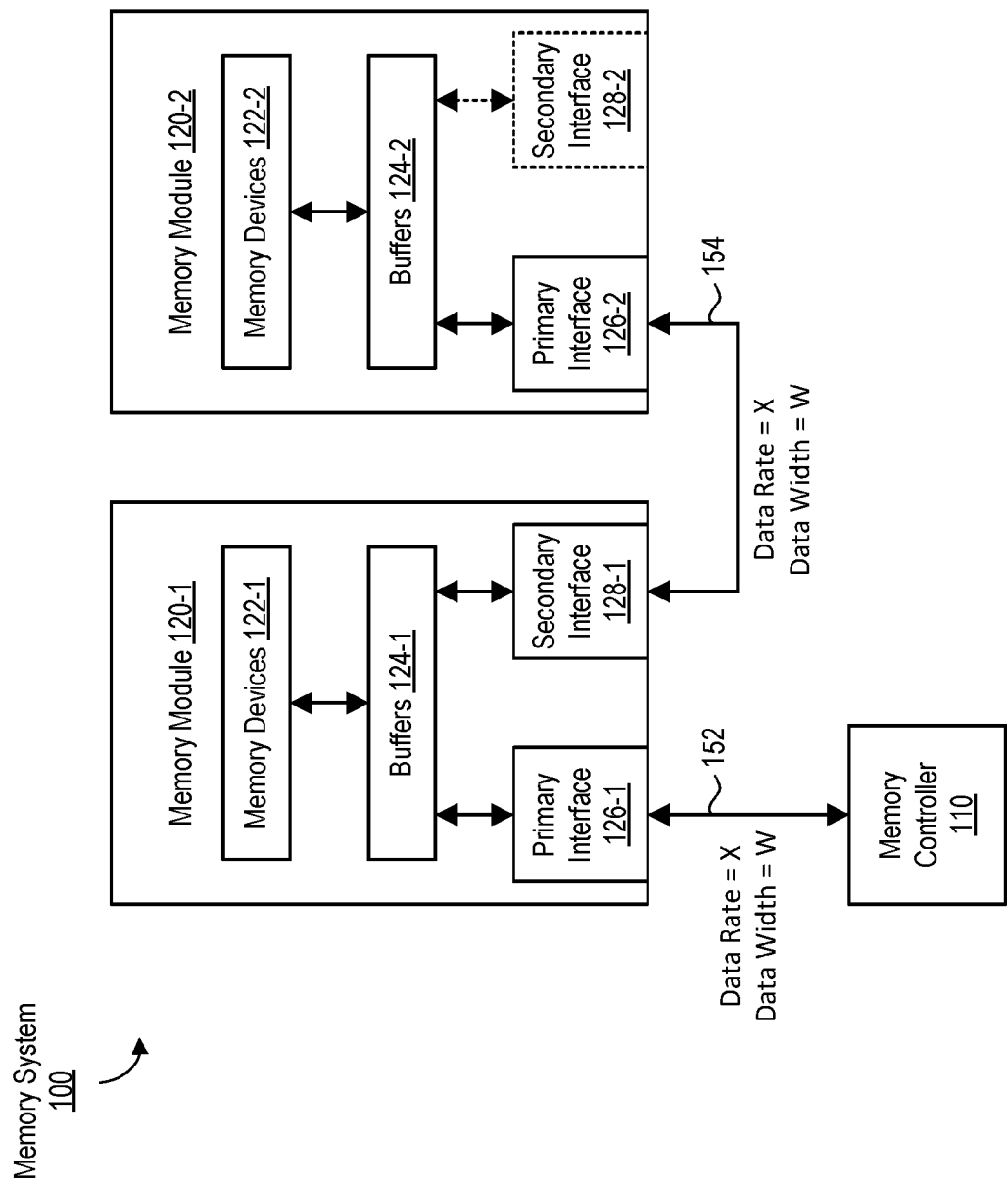
FIG. 1 illustrates a first example embodiment of a cascaded memory system.

FIG. 1 illustrates an example embodiment of a memory system 100 including a memory controller 110 and a plurality of memory modules 120 (e.g., a first memory module 120-1 and a second memory module 120-2). Each memory module 120 includes respective memories 122 (e.g., a first memory 122-1 and a second memory 122-2), respective buffers 124 (e.g., first buffers 124-1 and a second buffers 124-2), and respective primary interfaces 126 (e.g., a first primary interface 126-1 and a second primary interface 126-2). At least the first memory module includes a secondary interface 128-1. The secondary memory module 128-2 may optionally include or omit the secondary interface 128-2. In an embodiment, the first and second memory modules 120-1 each comprise Load Reduced Dual Inline Memory Modules (LRDIMMs). Alternatively, the first memory module 120-1 comprises an LRDIMM and the second memory module comprises a Registered Dual Inline Memory Module (RDIMM).

The memory controller 110 comprises a digital circuit that controls writing and reading of data to and from the memory modules 120. The memory controller 110 includes a data bus interface for communicating data to and from the memory modules 120, and a control bus interface for communicating control (e.g., command and address) signals to the memory modules 120. The control signals may include commands (e.g., a read command to read data from a memory module 120 or a write command to write data to a memory module 120) and address signals that specify which of the memory devices 122 is the target of the command.

The memory controller 110 is coupled to communicate via a first communication channel 152 to the primary interface 126-1 of the first memory module 120-1. The first communication channel 152 includes a data bus have a data width W (e.g., W signal lines) and communicates data between the primary interface 126-1 and the memory controller 110 at a data rate X (e.g., bits per second per signal line). The W signal lines may comprise bidirectional signal lines that can communicate data from the memory controller 110 to the first memory module 120-1 and from the first memory module 120-1 to the memory controller 110. Additionally, the first communication channel 152 may include a control bus for communicating commands and address information. The control bus may comprise a plurality of timing signal lines (e.g., W/4 bidirectional timing signal lines), N unidirectional command/address/control signals from the memory controller 110 to the memory module 120-1, and a unidirectional clock signal line from the memory controller 110 to the memory module 120-1. In an embodiment, the first communication channel 152 comprises signal lines on a motherboard. For example, the first communication channel 152 may be implemented as wires on an FR4 board substrate or other printed circuit board, either as wires escaping on a top layer of the substrate or as internal wires with via elements. Alternatively, the first communication channel 152 may comprise signal lines on a flexible cable or other link coupled to a connector on a carrier substrate of the memory controller 110. In an embodiment, the flexible cable may be utilized to carry the signal lines from a high wire density connection region in the region of the memory controller 110 to a lower wire density region on a printed circuit board away from the memory controller 110.

The primary interface 126-1 of the first memory module 120-1 is coupled to the first communication channel 152 to interface with the memory controller 110. The primary interface 126-1 has a data width W (e.g., W data pins) and operates at a data rate X. Additionally, the primary interface 126-1 may include control pins for receiving commands and address information.

The buffers 124-1 comprises three-port buffers that each include a first port coupled to the primary interface 126-1, a second port coupled to the secondary interface 128-1, and a third port coupled to the memory devices 122-1. The buffers 124-1 buffer and repeat signals (e.g., data and control signals) received from the primary interface 126-1 to the secondary interface 128-1 and similarly buffers and repeats signal received from the secondary interface 128-1 to the primary interface 126-1. The buffers 124-1 furthermore buffer signals received from the primary interface 126-1 to the memory devices 122-1 and buffer signals received from the memory devices 122-1 to the primary interface 126-1.

Here, the buffers 124-1 may provide routing of signals to an appropriate memory device 122 based on an address signal. In an embodiment, the buffers 124 may control ranks of memory devices 122-1 that share a common select line. A given memory rank may furthermore be split between the first memory module 120-1 and the second memory module 120-2. In this case, the first memory module 120-1 may can manage signals repeated to the second memory module 120-2 in accordance with any extra latency associated with the second communication channel 154.

The memory devices 122-1 may comprise dynamic random access memories (DRAMs) that store data to a write address in response to a write command and data received via the buffers 124-1 and output data from a read address in response to a read command. The memory devices 122-1 may be organized as, for example, single rank, dual rank, quad rank memory devices 122-1. The memory devices 122-1 may support read and write operations at the data rate X.

The secondary interface 128-1 interfaces between the buffers 124-1 of the first memory module 120-1 and the primary interface 126-2 of the second memory module 120-2 via a second communication channel 154. The secondary interface 128-1 may have a data width W (e.g., W data pins) and operates at a data rate X Additionally, the secondary interface 128-1 may include control pins for receiving commands and address information. In alternative embodiments, the secondary interface 128-1 of the first memory module 120-1, the second communication channel 154, and the primary interface 126-2 of the second memory module 120-2 may comprise differential interfaces with an embedded protocol to support generic memory types.

The second communication channel 154 includes a data bus having a data width W (e.g., W signal lines) and supports communications between the secondary interface 128-1 of the first memory module 120-1 and the primary interface 126-2 of the second memory module 120-2 at a data rate X (e.g., bits per second per signal line). Additionally, the second communication channel 154 may include a control bus for communicating commands and address information. In an embodiment, the second communication channel 154 comprises signal lines on a motherboard or other printed circuit board. Alternatively, the second communication channel 154 may comprise signal lines on a flexible cable or other link.

The second memory module 120-2 may be similar or identical to first memory module 120-1. For example, the second memory module 120-2 may comprise an LRDIMM with three port buffers 124-2 and a secondary interface 128-2. The primary interface 126-2 of the second memory module 120-2 is coupled to the secondary interface 128-1 of the first memory module 120-1 via the second communication channel 154. Thus, in operation, communications between the second memory module 120-2 and the memory controller 110 pass through the first memory module 120-1, which buffers and repeats the signals to improve signal integrity.

Alternatively, the second memory module 120-2 is not identical to the first memory module 120-1 and may lack the secondary interface 128-2. In this embodiment, the buffers 124-2 may comprise two-port instead of three-port buffers that buffer signals between the primary interface 126-2 and the memory devices 122-2. In this an embodiment, the second memory module 120-2 may comprise an LRDIMM or an RDIMM.

Figure 2:
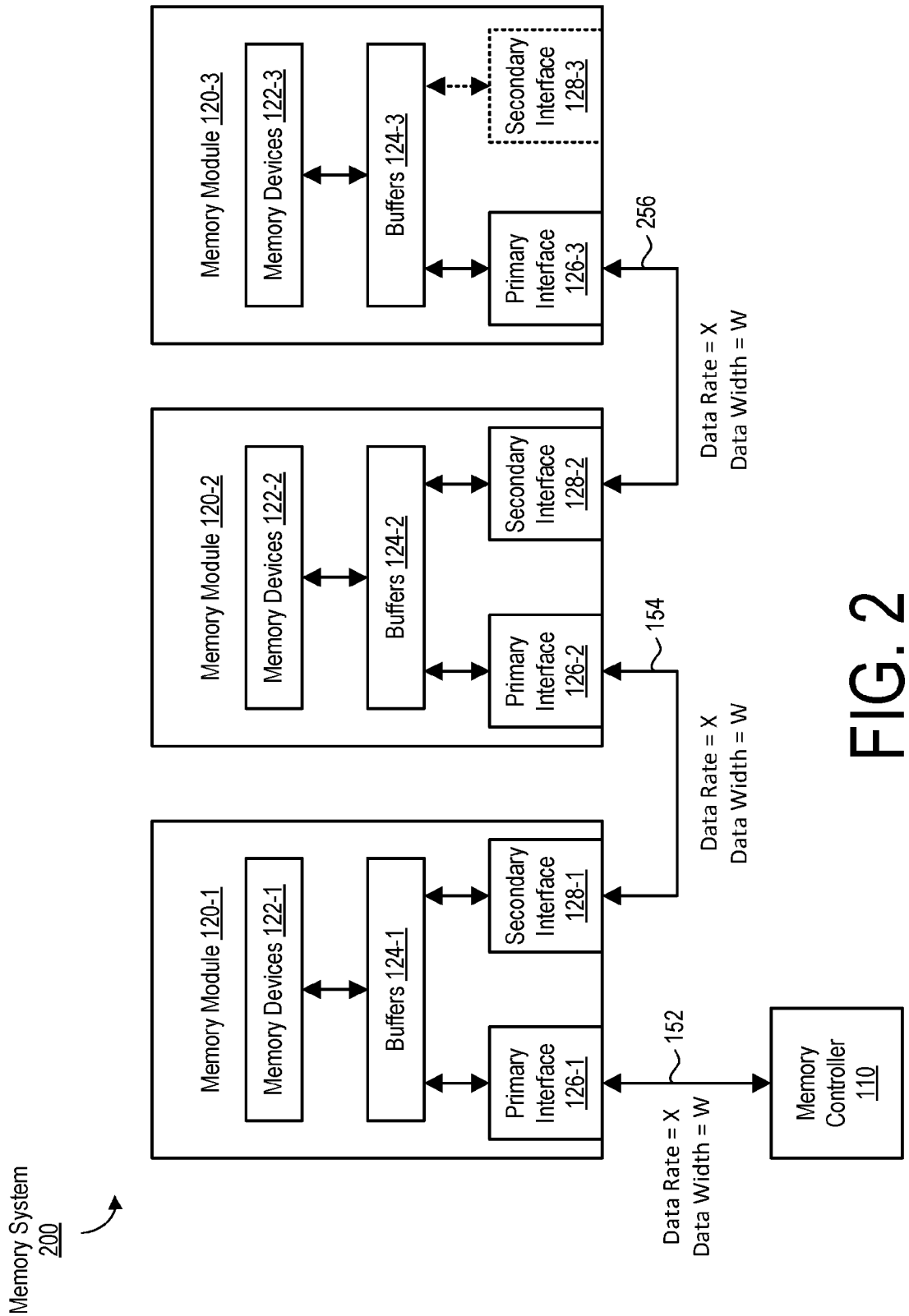
FIG. 2 illustrates a second example embodiment of a cascaded memory system.

FIG. 2 illustrates a second example embodiment of a cascaded memory system 200 that includes three memory modules 120 (e.g., a first memory module 120-1, a second memory module 120-2, and a third memory module 120-3) communicating with a memory controller 110. This first memory module 120-1 in this configuration is similar to the first memory module 120-1 in FIG. 1. The second memory module 120-2 includes the secondary interface 128-2 and three-port buffers 124-2 similar to the first memory module 120-2. The third memory module 120-3 includes a primary interface 126-3, buffers 124-3, memory devices 122-3, and optionally a secondary interface 128-3. Here, instead of the second memory module 120-2 being the last memory module 120 in the chain as in FIG. 1, the secondary interface 228-2 of the second memory module 220-2 couples to the primary interface 226-3 of the third memory module 220-3 via a third communication channel 256.

The third communication channel 256 includes a data bus have a data width W (e.g., W signal lines) and supports communications between the secondary interface 128-2 of the second memory module 120-2 and the primary interface 126-2 of the third memory module 120-3 at a data rate X (e.g., bits per second per signal line). Additionally, the third communication channel 256 may include a control bus for communicating commands and address information. In an embodiment, the third communication channel 256 comprises signal lines on a motherboard or other printed circuit board. Alternatively, the third communication channel 256 may comprise signal lines on a flexible cable or other link. Thus, in operation, communications between the third memory module 120-3 and the memory controller 110 pass through the first memory module 120-1 and the second memory module 120-2, which each buffer and repeat the signals to improve signal integrity.

The third memory module 120-3 may be identical to first and second memory modules 120-1, 120-2. For example, the third memory module 120-3 may comprise an LRDIMM with three-port buffers 124-3 and a secondary interface 128-3. Alternatively, the third memory module 120-3 is not identical to the first memory module 120-3 and may lack the secondary interface 128-3. In this embodiment, the buffers 124-3 may comprise two-port instead of three-port buffers that buffer signals between the primary interface 126-3 and the memory devices 122-3. In an embodiment, the third memory module 120-2 may comprise an LRDIMM or an RDIMM.

In other alternative embodiments, four or more memory modules 120 (e.g., N memory modules 120) may be cascaded together in a similar manner. In each configuration, the last (e.g., Nth) memory module 120 in the chain may optionally omit the secondary interface 128 and may comprise an LRDIMM or an RDIMM. Furthermore, in each configuration, the remaining memory modules 120 not including the last memory module 120 may generally comprise LRDIMMs while the last memory module 120 in the chain may optionally comprise an LRDIMM or RDIMM.

Figure 3:
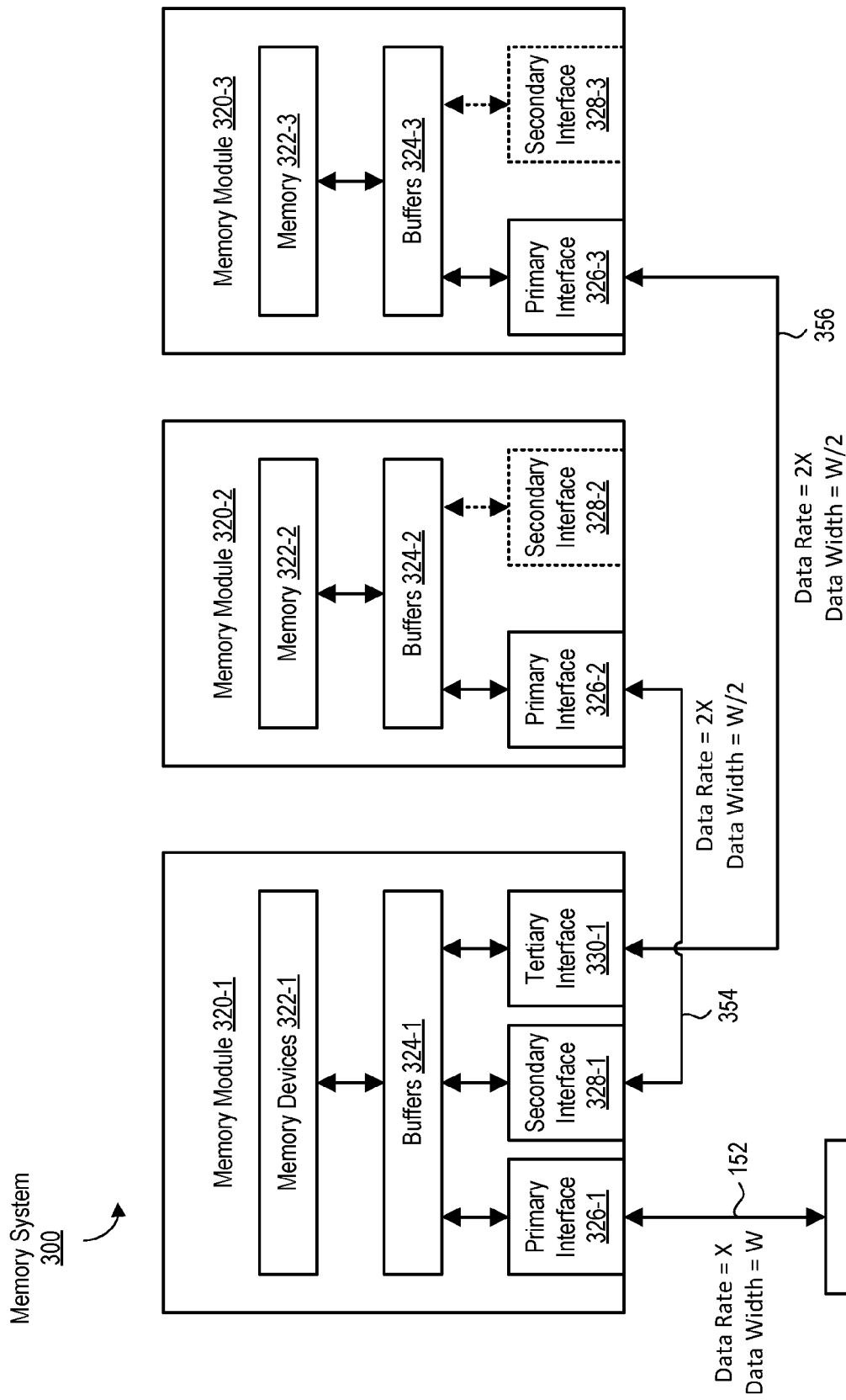
FIG. 3 illustrates a third example embodiment of a cascaded memory system.

FIG. 3 illustrates a third example embodiment of a cascaded memory system 300 that includes three memory modules 320 (e.g., a first memory module 320-1, a second memory module 320-2, and a third memory module 320-3) communicating with a memory controller 110. In this embodiment, the first memory module 320-1 includes a primary interface 326-1 coupled to the memory controller 110 via a first communication channel 152, a secondary interface 328-1 coupled to the second memory module 320-2 via a second communication channel 354, and a tertiary interface 330-1 coupled to the third memory module 320-3 via a third communication channel 356. In this embodiment, the buffers 324-1 of the first memory module 322-1 comprise four-port buffers that include a first port coupled to the primary interface 326-1, a second port coupled to the secondary interface 328-1, a third port coupled to the tertiary interface 330-1, and a fourth port coupled to the memory devices 322-1. In operation, signals communicated between the memory controller 110 and either the second memory module 320-2 or third memory module 320-3 are buffered and repeated by the buffers 324-1 of the first memory module 320-1 to ensure signal integrity.

In an embodiment, the first communication channel 152 supports communications between the memory controller 110 and the primary interface 326-1 of the first memory module 320-1 at a data rate X. The second communication channel 354 supports communications between the secondary interface 328-1 of the first memory module 320-1 and the primary interface 326-2 of the second memory module 320-2 at a data rate 2X that is double the rate of the first communication channel 152 and has a data width W/2 that is half the width of the first communication channel 152. The third communication channel 356 supports communications between the tertiary interface 330-1 of the first memory module 320-1 and the primary interface 326-3 of the third memory module 320-3 at a data rate 2X that is double the rate of the first communication channel 152 and has a data width W/2 that is half the width of the first communication channel 152. Thus, the secondary interface 328-1 and the tertiary interface 330-1 each use only half of the pins relative to the secondary interface 128-1 of the first memory module 120-1 described above.

The second memory module 320-2 and the third memory module 320-3 may be similar to the second memory module 120-2 described in FIG. 1. For example, the second memory module 320-2 and the third memory module 320-3 may comprise LRDIMMs with three or four-port buffers 324-2, 342-3 and respective secondary interfaces 328-2, 328-3. At least one of the second memory module 320-2 and the third memory module 320-3 may thus be structured similarly to the first memory module 320-1 even though the secondary interfaces 328-2, 328-3 are not necessarily connected. Alternatively, at least one of the second memory module 320-2 and the third memory module 320-3 are not identical to the first memory module 320-3 and may lack the respective secondary interfaces 328-2, 328-3. In this embodiment, the buffers 324-2, 324-3 of at least one of the first memory module 320-2, 320-3 may comprise two-port instead of three or four-port buffers. In an embodiment, at least one of the second memory module 320-2 and the third memory module 320-3 may comprise an RDIMM.

Figure 4:
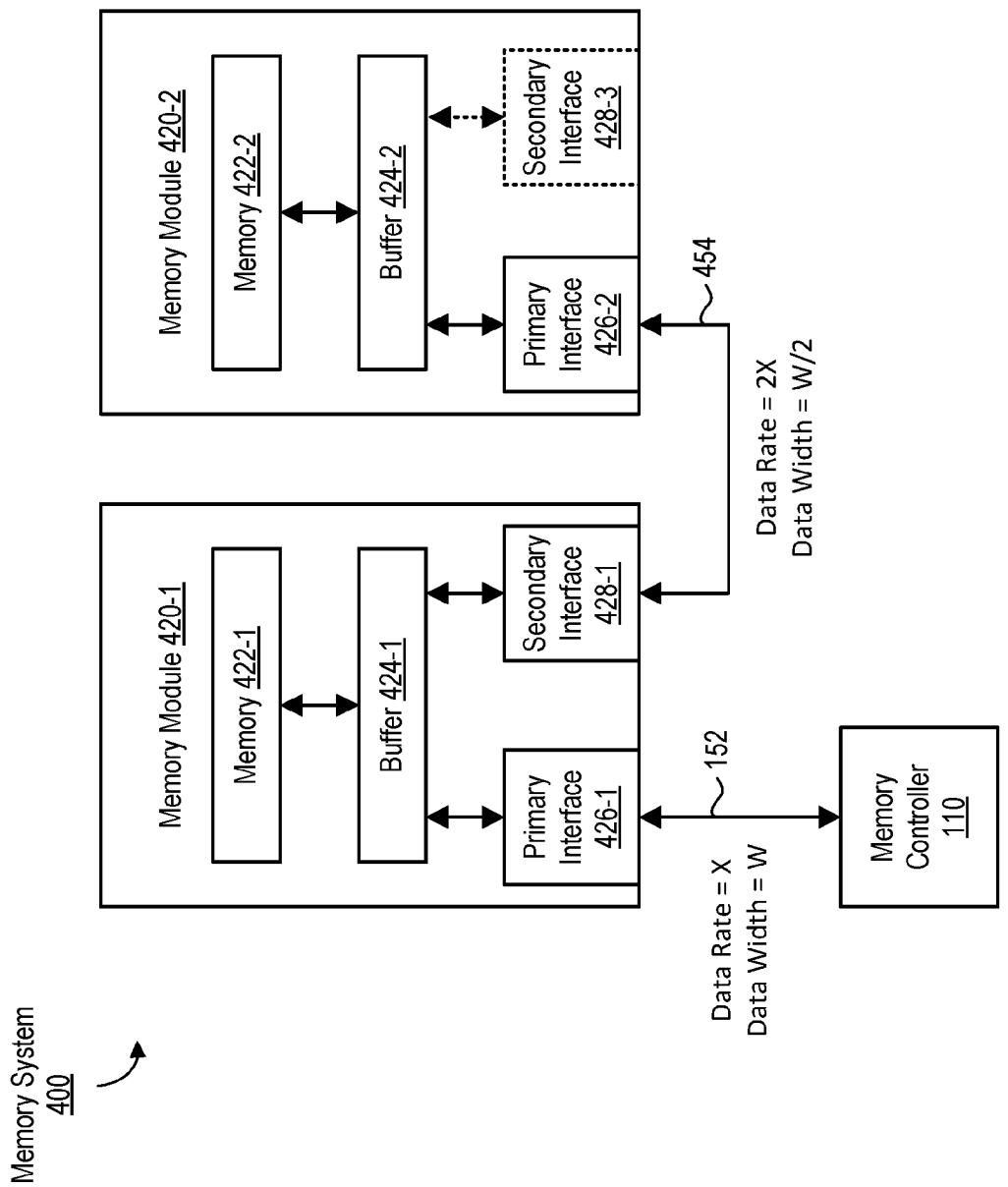
FIG. 4 illustrates a fourth example embodiment of a cascaded memory system.

FIG. 4 illustrates a fourth example embodiment of a cascaded memory system 400. This embodiment, is similar to the first embodiment of FIG. 1, except the secondary interface 428-1 of the first memory module 420-1 and the primary interface 426-2 of the second memory module 420-2 are configured to communicate over a second communication channel 454 at double the data rate (e.g., 2X) and half the data width (e.g., W/2) relative to communications over the first communication channel 152 between the primary interface 426-1 of the first memory module 420-1 and the memory controller 410. Thus, the secondary interface 428-1 of the first memory module 420-1 and the primary interface 426-2 of the second memory module 420-2 each use only half the data pins relative to the primary interface 426-1.

In an embodiment, a configurable memory module may be configurable for use as any of the of the memory modules 120, 320, 420 in FIGS. 1-4 described above. Here, a set of W pins may be configured as a single secondary interface having a data width W and operating at a data rate X or may be configured as two interfaces (e.g., a secondary interface and a tertiary interface) each having a data width W/2 and each operating at a data rate 2X. In other embodiments, the configurable memory module may be configured to buffer and repeat data to three or more downstream memory modules. For example, in a general case, a set of pins W may be configured as N interfaces to N respective memory modules in which each interface has a data width W/N and each interface operates at a data rate of N·X, where N is an integer. In an embodiment, $N=2^x$ where x is an integer.

The configuration of the W pins may be configurable based on a register in a memory device 122, 322, 422 or in a buffer 124, 224, 424 that stores a value controlling the pin configuration. The register may be set by via a command from the memory controller 110 (e.g., a register set command and a value for storing in the register that controls the pin configuration). Alternatively, the register may be set by asserting a voltage on a pin of the memory device 122, 322, 422 or buffer 124, 224, 424 (e.g., at power up) that causes a corresponding value to be stored in the register. Alternatively, the pin configuration may be controlled by one or more manual switches on the memory module 120, 320, 420.

Figure 5:
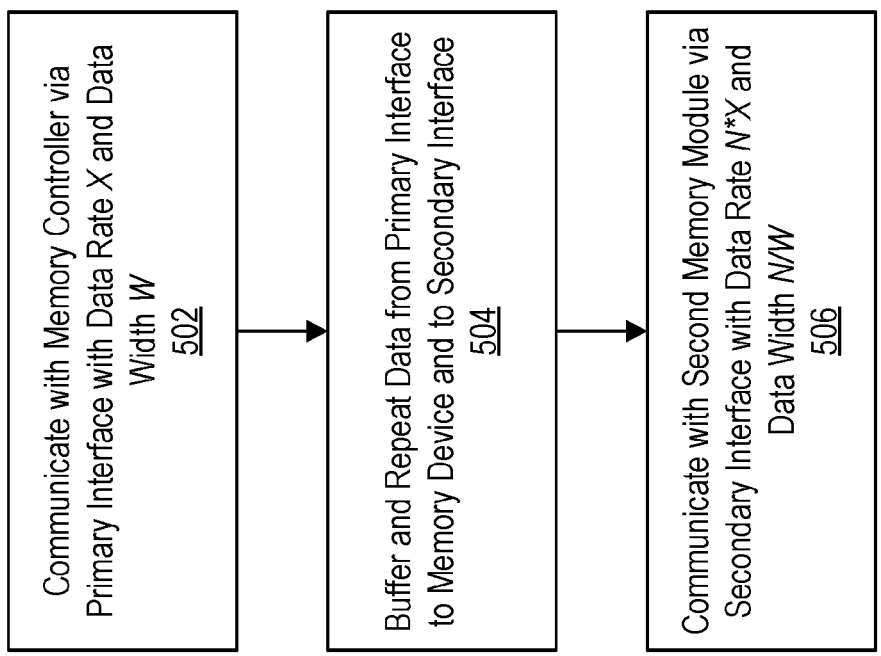
FIG. 5 illustrates an example embodiment of a process for operating a memory module of a cascaded memory system.

FIG. 5 illustrates an embodiment of a process for operating a memory module 120. The memory module 120 communicates 502 with the memory controller 110 (e.g., receives data and/or control commands or transmits data in response to a read command) via a primary interface 152 with a data rate X and a data width W. The memory module 120 buffers and repeats 504 data from the primary interface 126-1 to the memory devices 122 and to the secondary interface 128-1. The memory module communicates 506 (transmits or receives data) with the second memory module 120-2 via the secondary interface 128-1 with a data rate N·X and data width W/N where $N=2^x$ and where x is an integer.

In an embodiment, optimizations can be achieved for efficiency of data transfers to and from the memory controller 110. For example, read accesses to ranks on different communication channels can be scheduled with appropriate timing to avoid the DRAM pre-amble passing through to the memory controller 110. In a similar manner writes can be posted and scheduled more efficiently if the DRAM ranks are on different repeated channels.

Other optimizations than can be accomplished are the ability to schedule other commands such as maintenance type commands on one interface in parallel with normal operations on a second interface. Other additional operations such as local data transfers can be scheduled for copying data between different communication channels, for example if a memory module 120 coupled to a secondary interface 128 is configured with non-volatile memory or memory that could be made non-volatile in the event of a power failure. In a further embodiment, the buffered signals on the secondary interface 128-1 could comprise a non-native interface that is adapted by suitable buffers to the appropriate channel signaling, timing, and protocol.

Upon reading this disclosure, those of ordinary skill in the art will appreciate still alternative structural and functional designs and processes for a folded memory module. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the scope of the disclosure as defined in the appended claims.

What is claimed is:

1. A memory module comprising:
    a memory device;
    a primary interface having a first data width, the primary interface to communicate with a memory controller according to a first data rate;
    a secondary interface having a second data width that is 1/N times the first data width, the secondary interface to communicate with a second memory module according to a second data rate that is N times the first data rate;
    a buffer having a plurality of ports including a first port coupled to the primary interface, a second port coupled to the secondary interface, and a third port coupled to the memory device, the buffer for buffering data received over the plurality of ports and for repeating the data between the plurality of ports,
    wherein the second data width and the second data rate are configurable to respectively match the first data width and the first data rate based on a first register value and the second data width and the second data rate are configurable to respectively be less than the first data width and greater than the first data rate based on a second register value.

2. The memory module of claim 1, wherein the buffer repeats the data received on the first port to the second and third port, and repeats the data received on the second and third port to the first port.

3. The memory module of claim 1, wherein N=1.

4. The memory module of claim 1, wherein $N=2^x$ where x is an integer.

5. The memory module of claim 1, further comprising:
    a third interface having the second data width that is 1/N times the first data width, the third interface to communicate with a third memory module according to the second data rate that is N times the first data rate; and
    wherein the plurality of ports further comprises a fourth port coupled to the third interface.

6. The memory module of claim 1, wherein the memory module comprises an LRDIMM, and wherein the second memory module comprises an RDIMM.

7. The memory module of claim 1, wherein the memory device supports the first data rate.

8. The memory module of claim 1, wherein the primary interface couples to first data lines of a printed circuit board between the memory module and the memory controller, and wherein the secondary interface couples to second data lines of the printed circuit board between the memory module and the second memory module.

9. The memory module of claim 1, wherein the primary interface couples to first data lines of a first flex cable between the memory module and the memory controller, and wherein the secondary interface couples to second data lines of a second flex cable between the memory module and the second memory module.

10. A memory system comprising:
    a memory controller;
    a first memory module including a first memory device, a first primary interface having a first data width, a first secondary interface having a second data width that is 1/N times the first data width, and a first buffer having a first plurality of ports including a first port coupled to the first primary interface, a second port coupled to the first secondary interface, and a third port coupled to the first memory device, the first buffer to buffer data received over the first plurality of ports and to repeat the data between the first plurality of ports, and wherein the first memory module is configured to communicate with the memory controller over the first primary interface according to a first data rate and to communicate over the first secondary interface according to a second data rate that is N times the first data rate; and
    a second memory module coupled to the first secondary interface of the first memory module,
    wherein the second data width and the second data rate are configurable to respectively match the first data width and the first data rate based on a first register value and the second data width and the second data rate are configurable to respectively be less than the first data width and greater than the first data rate based on a second register value.

11. The memory system of claim 10, wherein the second memory module comprises:
    a second memory device;
    a second primary interface having the second data width that is 1/N the first data width;
    a second buffer having a second plurality of ports coupled to at least the second memory device and the second primary interface, the second buffer to buffer data received over the second plurality of ports and to repeat the data between the second plurality of ports;
    wherein the second memory module is configured to communicate with the first memory module over the second primary interface according to the second data rate that is N times the first data rate.

12. The memory system of claim 11, where in the second memory module further comprises a second secondary interface, the memory system further comprising:
    a third memory module coupled to the second secondary interface of the second memory module, the third memory module comprising:
    a third memory device;
    a third primary interface;
    a third buffer having a third plurality of ports coupled to at least the third memory device and the third primary interface, the third buffer to buffer data received over the third plurality of ports and to repeat the data between the third plurality of ports.

13. The memory system of claim 12, wherein the first and second memory modules comprise LRDIMMs and wherein the third memory module comprises an RDIMM.

14. The memory system of claim 12, further comprising:
    a third memory device;
    a third primary interface having a third data width that is 1/N the first data width;
    a third buffer having a third plurality of ports coupled to at least the third memory device and the third primary interface, the third buffer to buffer data received over the third plurality of ports and to repeat the data between the third plurality of ports;
    wherein the third memory device is configured to communicate with the first memory module over the third primary interface according to the second data rate that is N times the first data rate.

15. The memory system of claim 14, wherein the first memory module comprises an LRDIMM and wherein at least one of the second and third memory modules comprises an RDIMM.

16. A method for operating a memory system, the method comprising:

communicating over a first communication channel with a memory controller via a primary interface of a first memory module having a first data width and operating at a first data rate;

buffering and repeating data received over a first port of a buffer coupled to the primary interface to a second port of the buffer coupled to a memory device and to a third port of the buffer coupled to a secondary interface of the first memory module;

communicating, over a second communication channel, the buffered and repeated data on the secondary interface to a second memory module via the secondary interface having a second data width that is 1/N times the first data width and that operates at a second data rate that is N times the first data rate; and wherein the second data width and the second data rate are configurable to respectively match the first data width and the first data rate based on a first register value and the second data width and the second data rate are configurable to respectively be less than the first data width and greater than the first data rate based on a second register value.

17. The method of claim 16, further comprising:
buffering and repeating the data received by the second memory module to a third memory module over a third communication channel coupled to a secondary interface of the second memory module.

18. The method of claim 16, further comprising:
buffering and repeating the data received over a first port of the buffer coupled to the primary interface to a fourth port of the buffer coupled to a tertiary interface of the first memory module; and communicating over a third communication channel, the buffered and repeated data on the tertiary interface to a third memory module via the tertiary interface having the second data width that is 1/N times the first data width and that operates at the second data rate that is N times the first data rate.

19. The method of claim 16, where N=1.

20. The method of claim 16, wherein $N=2^x$ where x is an integer.

21. The method of claim 16, wherein the first memory module comprises an LRDIMM and wherein the second memory module comprises an RDIMM.

* * * * *